United States Patent
Oh et al.

[19]

[11] Patent Number: 6,061,246
[45] Date of Patent: May 9, 2000

[54] MICROELECTRIC PACKAGES INCLUDING FLEXIBLE LAYERS AND FLEXIBLE EXTENSIONS, AND LIQUID CRYSTAL DISPLAY MODULES USING THE SAME

[75] Inventors: Choong-seob Oh; Jin-hyeok Park; Hyun-sang Cho, all of Kyonggi-do, Rep. of Korea

[73] Assignee: Samsung Electronics Co., Ltd., Rep. of Korea

[21] Appl. No.: 09/123,570

[22] Filed: Jul. 27, 1998

[30] Foreign Application Priority Data

Sep. 13, 1997 [KR] Rep. of Korea ................. 97-47400

[51] Int. Cl.[7] ................. H05K 1/11; H05K 7/06; G02F 1/1345
[52] U.S. Cl. ................. 361/749; 361/750; 361/761; 361/764; 361/777; 174/254; 174/261; 349/150; 349/152
[58] Field of Search ................. 361/749–751, 361/783, 789, 761, 762, 764, 777; 349/149–152; 174/254, 261; 439/67; 257/786; 29/832, 854

[56] References Cited

U.S. PATENT DOCUMENTS

| | | |
|---|---|---|
| 3,718,936 | 2/1973 | Rice, Jr. ................. 174/261 |
| 4,116,517 | 9/1978 | Selvin et al. ................. 439/67 |
| 4,295,711 | 10/1981 | Tanaka et al. ................. 349/150 |
| 4,413,308 | 11/1983 | Brown ................. 361/764 |
| 4,677,528 | 6/1987 | Miniet ................. 361/751 |
| 4,776,806 | 10/1988 | Adams ................. 439/67 |
| 5,001,604 | 3/1991 | Lusby ................. 361/749 |
| 5,206,463 | 4/1993 | DeMaso et al. ................. 174/254 |
| 5,224,023 | 6/1993 | Smith et al. ................. 439/67 |
| 5,311,396 | 5/1994 | Steffen ................. 361/783 |
| 5,359,227 | 10/1994 | Liang et al. ................. 257/786 |
| 5,398,128 | 3/1995 | Tajima et al. ................. 349/150 |
| 5,479,110 | 12/1995 | Crane et al. ................. 439/67 |
| 5,723,205 | 3/1998 | Millette et al. ................. 361/750 |
| 5,737,053 | 4/1998 | Yomogihara et al. ................. 349/150 |
| 5,838,546 | 11/1998 | Miyoshi ................. 361/749 |

FOREIGN PATENT DOCUMENTS 60-35524 2/1985 Japan ................. 257/786

*Primary Examiner*—Leo P. Picard
*Assistant Examiner*—John B. Vigushin
*Attorney, Agent, or Firm*—Myers Bigel Sibley & Sajovec

[57] ABSTRACT

The printed circuit board and tape carrier package of an LCD module are replaced with a microelectronic package that includes a substrate and a layer integrally formed on the substrate that is flexible relative to the substrate. The flexible layer includes at least one flexible extension that extends beyond the substrate. A plurality of conductive lines are included on the substrate that extend onto the flexible layer and extend along the flexible layer onto the at least one flexible extension. The conductive lines on the flexible extension are electrically connected to the data lines, the gate lines or both. Accordingly, tape carrier packages need not be used so that cost may be reduced. Moreover, separate operations to connect tape carrier packages to printed circuits boards may be eliminated, thereby improving reliability and/or cost of the device.

20 Claims, 4 Drawing Sheets

MICROELECTRIC PACKAGES INCLUDING FLEXIBLE LAYERS AND FLEXIBLE EXTENSIONS, AND LIQUID CRYSTAL DISPLAY MODULES USING THE SAME

FIELD OF THE INVENTION

This invention relates to microelectronic devices such as liquid crystal display (LCD) modules, and more particularly to mounting packages for microelectronic devices including LCD modules.

BACKGROUND OF THE INVENTION

Liquid crystal displays (LCDs) are a well known form of flat panel display. As is well known to those having skill in the art, a liquid crystal display generally includes a thin film transistor (TFT) substrate that itself includes a plurality of spaced apart gate lines and a plurality of spaced apart data lines. The plurality of spaced apart data lines intersect the plurality of spaced apart gate lines, generally orthogonally. A liquid crystal display may also generally include a color filter substrate spaced apart from the TFT substrate, and a liquid crystal material between the TFT substrate and the color filter substrate. Each intersecting area of a gate line and a data line can include a thin film transistor and a pixel electrode, to form switching devices.

The data lines receive a gray scale voltage selected by a data driving integrated circuit and transmit the gray scale voltage to the liquid crystal material. The gate lines open or close the TFT in response to signals provided from a gate driving integrated circuit. The construction and operation of an LCD are well known to those having skill in the art and need not be described further herein.

FIG. 1 is a schematic perspective view of an LCD module. As shown in FIG. 1, the LCD module includes an LCD panel 10 including the spaced apart gate lines and data lines thereon and a printed circuit board (PCB) 20 that provides signals to the data lines and/or gate lines. In order to supply the data lines and the gate lines with driving signals, a timing controller and various other integrated circuit components may be mounted on PCB 20. The PCB 20 and the LCD panel 10 are conventionally interconnected by a tape carrier package (TCP) 30 including a tape carrier 33 on which a driving integrated circuit 31 is mounted. Driving integrated circuit 31 transmits the driving signals to the gate lines and the data lines.

As shown in FIG. 1, the PCB 20 is generally a multilayer PCB. The PCB 20 and the LCD panel 10 are interconnected using the TCP 30. The pitches between the output lines 36 may be approximately 0.1 mm. An anisotropic conductive film (ACF) is attached to the respective input pads of the LCD panel 10 and the output lines 36 of the TCP 30 are heat pressed and attached to the LCD panel 10. Since the pitches between the inputs 35 of the TCP 30 and the conductive lines on the PCB 20 are wider than the input pads of the LCD panel, the TCP 30 is connected to the PCB 20 by soldering or by using an anisotropic conductive film.

Unfortunately, the use of a TCP 30 to interconnect and LCD panel 10 to a PCB 20 may increase the cost of the LCD module and/or decrease the reliability thereof. The cost may be increased because the price of a tape carrier for the TCP may be almost the same as the price of the driving IC itself. Moreover, the width of the tape carrier is standardized at 35–48 mm. Accordingly, the input and output lines of the tape carrier may be fixed according to the standardized width thereof, and the number of input and output leads to the driving IC may be limited. Accordingly, larger numbers of driving ICs may be used. Moreover, since the TCP is attached to the PCB, an additional process step may be needed. This process step may include manual intervention to align the TCP 30 to the PCB 20.

The reliability of the LCD module may also be impacted because the solid portions between the PCB and the TCP and the bonded portions between the tape carrier and the driving IC may be damaged due to differences in thermal expansion coefficients. Expansion and contraction may repeatedly occur in an LCD module due to changes in the thermal environment of a backlight unit. For example, the temperature of the backlight unit may vary over a 60° range.

SUMMARY OF THE INVENTION

It is therefore an object of the present invention to provide improved LCD modules and microelectronic packages.

It is another object of the invention to provide improved LCD modules that need not use tape carrier packages to attach a printed circuit board to an LCD panel.

These and other objects are provided, according to the present invention, by replacing the printed circuit board and tape carrier package of an LCD module with a microelectronic package that includes a substrate and a layer integrally formed on the substrate that is flexible relative to the substrate. The flexible layer includes at least one flexible extension that extends beyond the substrate. A plurality of conductive lines are included on the substrate that extend onto the flexible layer and extend along the flexible layer onto the at least one flexible extension. The conductive lines on the flexible extension are electrically connected to the data lines, the gate lines or both. Accordingly, tape carrier packages need not be used so that cost may be reduced. Moreover, separate operations to connect tape carrier packages to printed circuits boards may be eliminated, thereby improving reliability and/or cost of the device.

More particularly, according to the invention, a liquid crystal display (LCD) module includes an LCD panel comprising a plurality of spaced apart data lines and a plurality of spaced apart gate lines that intersect the data lines. A microelectronic package is also included as part of the LCD module. The microelectronic package includes a first substrate and a second substrate that is spaced apart from the first substrate. An intermediary layer is included between the first and second spaced apart substrates. The intermediary layer is flexible relative to the first and second spaced apart substrates.

The intermediary layer also includes at least one flexible extension that extends beyond the first and second spaced apart substrates. A plurality of conductive lines is included on at least one of the first and second spaced apart substrates, that extend onto the flexible intermediary layer and extend along the flexible intermediary layer onto the at least one flexible extension. The plurality of conductive lines on the at least one flexible extension are electrically connected to the data lines, the gate lines, or both.

In a preferred embodiment, the first and second spaced apart substrates are first and second printed circuit boards. The at least one flexible extension may comprise a plurality of flexible extensions that extend in parallel beyond the first and second spaced apart substrates.

Both the flexible extensions and the LCD panels include connecting pads thereon at corresponding locations to facilitate electrical connection therebetween. In one embodiment, a plurality of first connecting pads is included on the at least one flexible extension, a respective one of which is connected to a respective one of the plurality of conductive lines. A plurality of second connecting pads is included on the LCD panel, at locations corresponding to the plurality of first connecting pads. A respective one of the second connecting pads is connected to a respective one of the plurality of data lines or gate lines. The plurality of first connecting pads is connected to the plurality of second connecting pads.

In one embodiment, the first and second connecting pads are nonlinearly arranged on the at least one flexible extension and on the LCD panel. For example, the first and second connecting pads are arranged in a plurality of repeated slanting lines on the at least one flexible extension and on the LCD panel. In another embodiment, the first and second connecting pads are arranged in two rows of alternating pads on the at least one flexible extension and on the LCD panel.

An integrated circuit mounting region is included on the microelectronic package, and at least one integrated circuit is mounted on the integrated circuit mounting region. In one embodiment, the integrated circuit mounting region and the at least one integrated circuit are on one of the first and second spaced apart substrates opposite the intermediary layer. In another embodiment, one of the first and second spaced apart substrates includes at least one aperture that exposes the intermediary layer. The integrated circuit mounting region and the at least one integrated circuit are on the intermediary layer exposed by the at least one aperture.

As described above, a microelectronic package including at least one flexible intermediate layer with flexible extensions can improve the cost and/or reliability of interconnection of integrated circuits to an LCD module. However, the microelectronic package including the flexible layer and flexible extensions may be used in other microelectronic packaging environments where it is desired to mount integrated circuits on a microelectronic package and to connect the microelectronic package to other packages or devices. In these applications, the flexible layer and the at least one flexible extension can provide a low cost and/or high reliability microelectronic package for mounting microelectronic devices thereon.

DETAILED DESCRIPTION OF PREFERRED EMBODIMENTS

Figure 1:
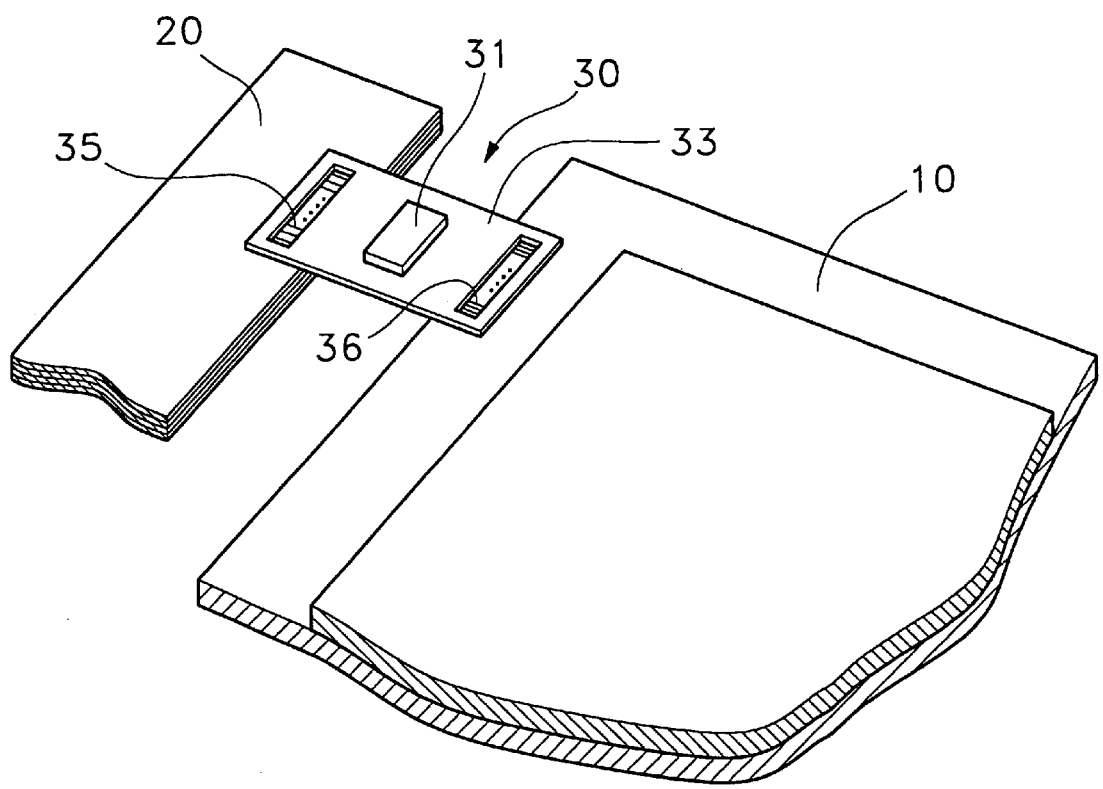
FIG. 1 is a schematic perspective view of a conventional LCD module including an LCD panel and a printed circuit board.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 2:
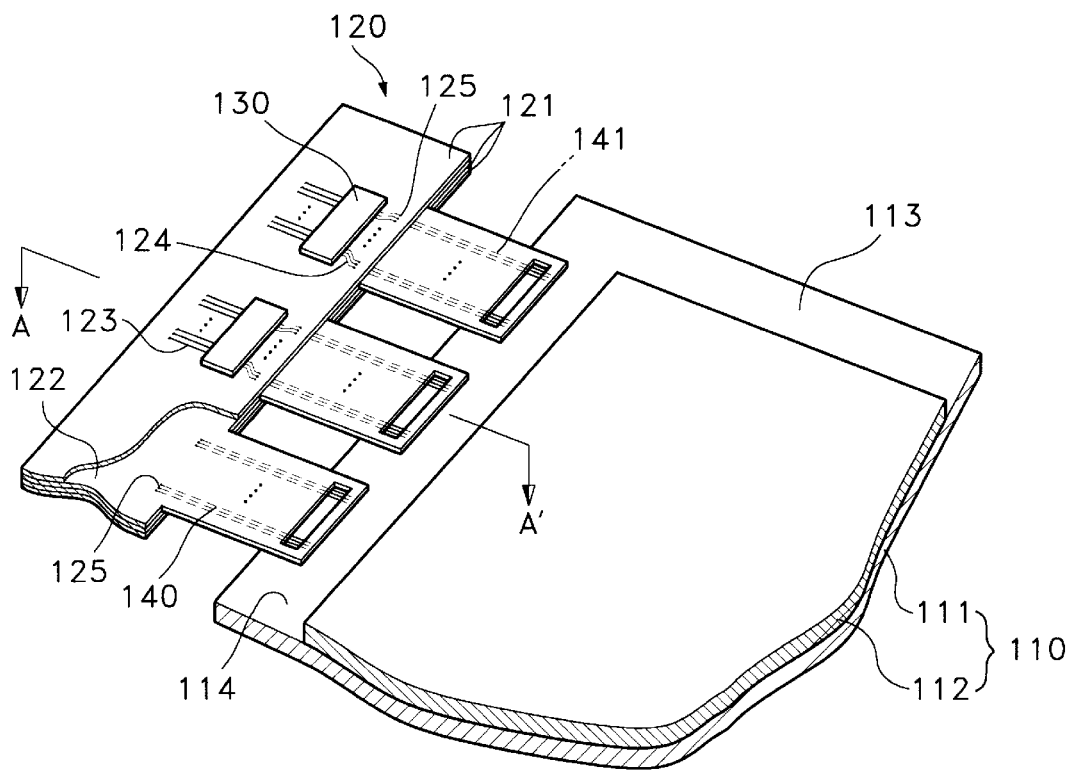
FIG. 2 is a perspective view of an LCD module including a microelectronic package and an LCD panel according to the present invention.

Referring now to FIG. 2, LCD modules according to the present invention are illustrated. The LCD module includes an LCD panel 110 and a microelectronic package 120. The microelectronic package 120 is connected to the LCD panel 110 using flexible extensions 140 that extend from the microelectronic package 120, as will be described below.

Figure 4A:
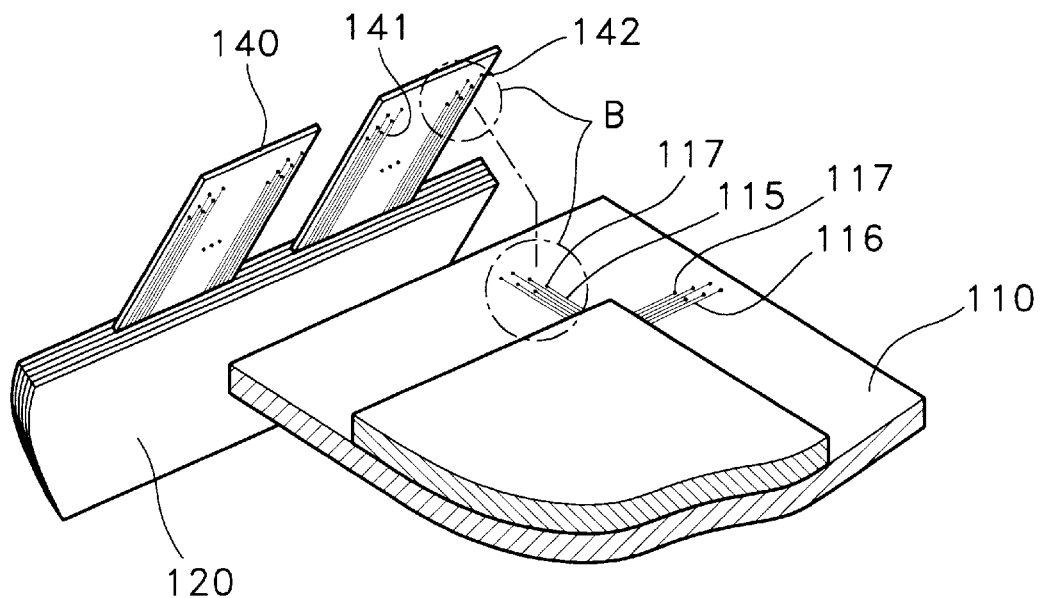
FIG. 4A is a perspective view of an LCD module prior to interconnection to an LCD panel, illustrating the connection of first connecting pads on a flexible extension to corresponding second connecting pads on the LCD panel.

Still referring to FIG. 2, LCD panel 110 includes a TFT substrate 111 and a color filter substrate 112. As shown in FIG. 4A, a plurality of gate lines 115 extend horizontally and a plurality of data lines 116 extend vertically. However, these directions may be reversed. The gate lines 115 and data lines intersect each other, preferably orthogonally.

Referring again to FIG. 2, microelectronic package 120 is connected to the gate line area 114 of LCD panel 110. However, the same microelectronic package 120 or another microelectronic package 120 may be connected to the data line area 113 of the LCD panel 110. The microelectronic package 120 transmits electric signals to the LCD panel 110, and driving ICs 130 are mounted on microelectronic package 120 to drive the LCD panel 110.

Figure 3:
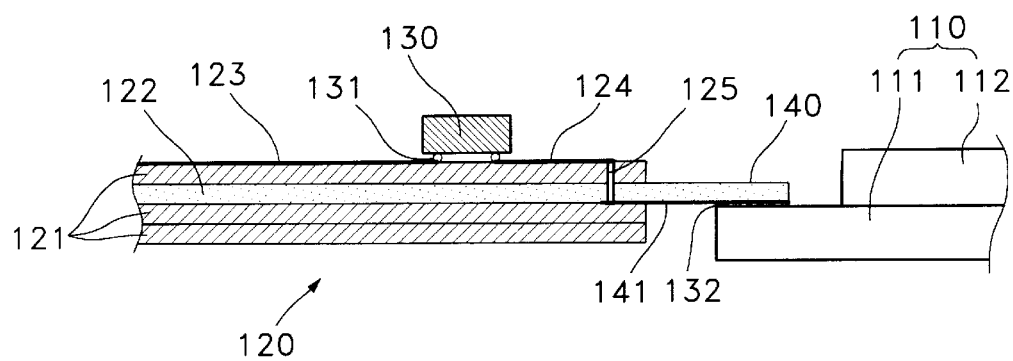
FIG. 3 is a cross-sectional view taken along the line A–A' of FIG. 2.

As shown in FIGS. 2 and 3, the microelectronic package 120 includes a plurality of substrates 121 and an intermediary layer 122 therebetween. The intermediary layer 122 is flexible relative to the substrates 121. The intermediary layer includes at least one flexible extension 140 that extends beyond the spaced apart substrates 121.

It will be understood that the substrates 121 may be printed circuit boards, glass ceramic substrates or other conventional microelectronic substrates. The intermediary layer 122 may be formed of a polyimide material or other heat resistant flexible synthetic resins.

As shown in FIGS. 2 and 3, a plurality of conductive lines 123 and 124 are included on at least one of the substrates 121. These lines extend onto the flexible intermediary layer 122 using conductive via holes 125. The conductive lines 141 also extend onto the flexible extension and are electrically connected to the plurality of spaced apart data lines and/or the plurality of spaced apart gate lines. At least one integrated circuit 130 is mounted on microelectronic package 120 and is preferably connected to conductive lines 123 and 124. Thus, lines 123 may be input lines and lines 124 and 141 may be output lines for the integrated circuit 130. The connection between the integrated circuit 130 and the conductive lines 123 and 124 may use solder bumps 131 or other interconnection techniques.

It will be understood that the flexible extensions 140 and the flexible intermediary layer 122 are integrally formed on the substrate 120, as opposed to being attached using ACF or solder after formation of the microelectronic package 120.

As shown in FIG. 2, a plurality of flexible extensions 140 are provided that extend beyond substrates 121. However, a single large flexible extension 140 may also be provided that extends along the entire side of the substrates 121.

As also shown in FIG. 2, the input lines 123 may be formed at a predetermined location of the exposed surface of the microelectronic package 120 in such a manner that the pitches between the input lines 123 are wide. Input leads of the driving IC 130 are attached to the input lines 123. The output lines 124 and 141 can be formed at a location on the microelectronic package 120 opposite to the location of the input lines 123 in such a manner that the pitch between the output lines 124 and 141 are relatively small. Output leads of the driving IC are electrically connected to the output lines 124 and 141.

The output lines 124 are connected to the flexible layer 122 using conductive via holes 125. The conductive lines 141 on flexible layer 122 extend from the conductive via holes 125 onto the flexible extension 140 and are electrically connected to the LCD panel 110 using anisotropic conductive film 132, solder or other electrical connection techniques.

Figure 4B:
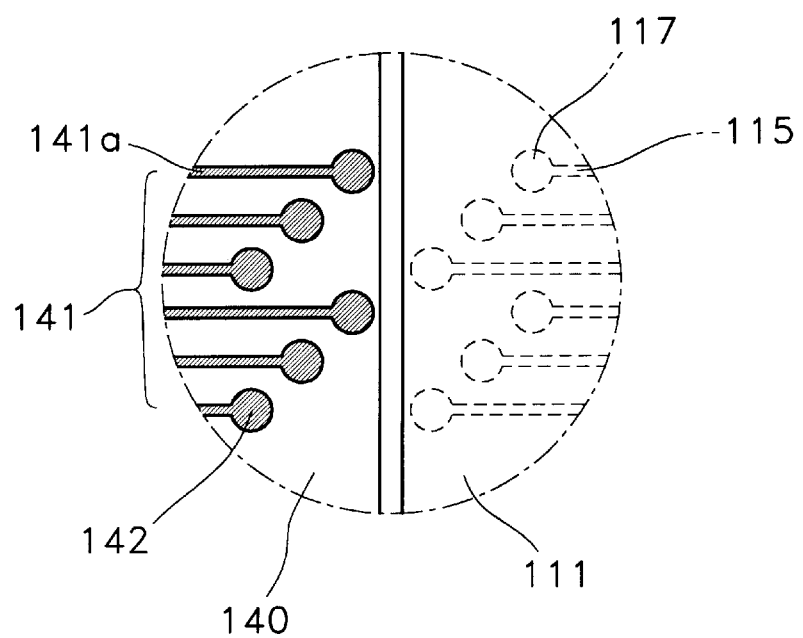
FIG. 4B is an enlarged close-up view of portion B of FIG. 4A.
Figure 5:
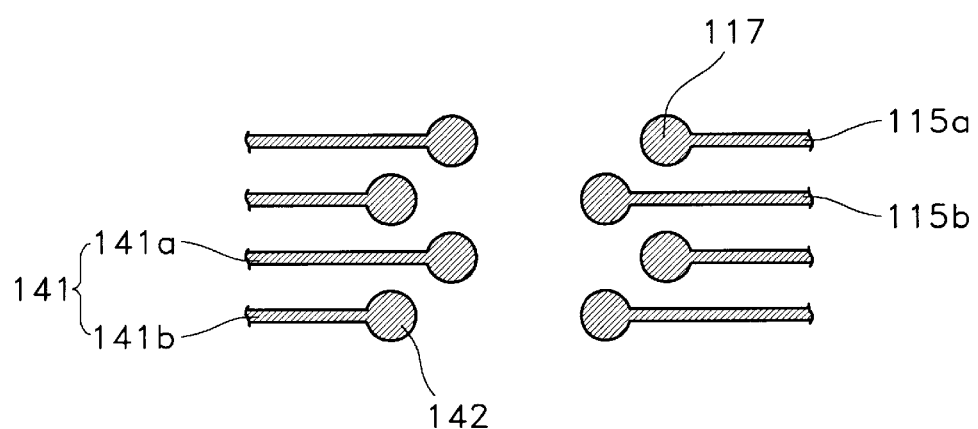
FIG. 5 is another embodiment of connecting pads of FIG. 4B.

As shown in FIGS. 4A, 4B and 5, a plurality of first connecting pads 142 are provided on the at least one flexible extension 140. A respective one of the first connecting pads 142 is connected to a respective one of the plurality of conductive lines 141. A plurality of second connecting pads 117 is also provided on the LCD panel 110 at locations corresponding to the plurality of first connecting pads 142. A respective one of the second connecting pads 117 is connected to a respective one of the plurality of data lines or gate lines. In FIGS. 4A and 4B, the second connecting pads 117 are connected to the gate lines 115.

In order to enlarge the size of the connecting pads 142 and 117, and to reduce the likelihood of short circuits therebetween, the connecting pads 142 and 117 are preferably not linearly arranged, i.e. not arranged in one straight line. Thus, as shown in FIGS. 4A and 4B, the first and second connecting pads 142 and 117 are arranged in a plurality of repeated slanting lines. In contrast, in FIG. 5, they are arranged in two rows of alternating pads. In order to accommodate the placements of FIGS. 4B and 5, the conductive lines 141 may have different lengths 141a, 141b. Similarly, the gate lines may have different lengths 115a, 115b, so the pads 117 are not arranged in a straight line.

Stated differently, as shown in FIG. 4B, the conductive lines 141 may be grouped in groups of three gradually shortened lines. The longest line 141a is located at the uppermost position, the second longest is located at the center position, and the shortest is located at the lowest position. As a result, when the connecting pads 142 are formed on the ends of the output lines 141, they are arranged in a repeated slanting line. As shown in FIG. 5, the connecting pads 142 may be arranged in a zig-zag at the ends of alternatively arranged long and short output lines 141a and 141b.

The connecting pads themselves may be formed in a circular, rectangular, triangular or other shape. Most preferably, the connecting pad is formed in a circular shape, to allow reduction in the difference in lengths of the conductive lines. As shown in FIGS. 4B and 5, the second connecting pads 117 on the LCD panel 110 are arranged corresponding to the first connecting pads 142 on the flexible extension 140.

Figure 6:
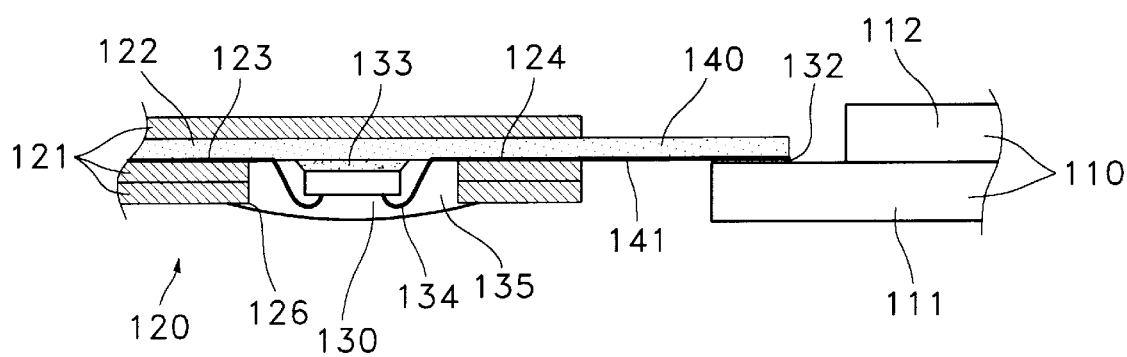
FIG. 6 is a cross-sectional view of an LCD module according to the invention including a driving IC according to the invention.

Integrated circuits such as driving IC 130 may be mounted on the microelectronic package 120 using flip-chip technology or chip-on-board (COB) technology, as shown in FIGS. 3 and 6, respectively. As shown in FIG. 3, when the driving IC is mounted on the microelectronic package 120 using flip-chip technology, the input and output leads of the driving IC may be attached to the input lines 123 and the output lines 124 using a conductive adhesive material 131, solder bumps or other conventional technologies. As shown in FIG. 6, when the driving IC 130 is mounted on the microelectronic package using COB technology, at least one aperture 126 is formed in at least one of the substrates 121, so that predetermined portions of the flexible layer 122 are exposed. The driving IC is inserted and mounted in the aperture 126 and connected to conductive lines 123 and/or 124. Accordingly, the height of the microelectronic package 120 can be reduced.

An insulating adhesive material 133 may be attached between the flexible layer 122 and the driving IC 130. A bonding pad on the top surface of the driving IC 130 is electrically connected to the input lines 123 and the first output lines 124 by wires 134. Then, the driving IC 130 and the wires 134 are hermetically enclosed by resin 135.

Accordingly, flip-chip technology may allow the driving IC to be more readily repaired and may be simpler than COB mounting for reduced costs. In contrast, in COB technology, a more compact and rugged structure may be obtained.

The microelectronic package may be electrically connected to the LCD panel by placing anisotropic conductive film 132 on the first connecting pads 142, on the second connecting pads 117, or on both. Preferably, anisotropic conductive film 132 is attached to the second connecting pads 117. The first connecting pads 142 are aligned to the second connecting pads 117 and then pressed together using conventional techniques for electrical connection.

Accordingly, a microelectronic package including at least one flexible layer is used. The flexible layer includes at least one flexible extension. Conductive lines are formed on the flexible layer and extending along the flexible extension, so that separate steps for connecting inputs of a connecting member to a PCB need not be performed. Moreover, soldering need not be used between a PCB and the connecting member. Moreover, since the driving IC can be mounted on a microelectronic package having the same thermal expansion coefficient, damage to bonded portions of the driving IC due to differences in the thermal expansion coefficients of the PCB and the driving IC can be reduced.

Since the driving IC can be mounted on the microelectronic package using flip-chip or COB technologies, high density input/output connections for these ICs may be provided. Accordingly, it is possible to increase the numbers of input lines and output lines. Thus, a driving IC including large numbers of input and output lines can be used. A reduced number of driving ICs can then be used for a given size LCD panel.

The present invention can obviate the need for costly tape carriers and the limitations thereof in input and output line pitch. Accordingly, simplified fabrication, lower cost and/or higher reliability can be obtained.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A microelectronic package for mounting microelectronic devices thereon, comprising:

a first substrate and a second substrate that is spaced apart from the first substrate;

an intermediary layer between the first and second spaced apart substrates, the intermediary layer being flexible relative to the first and second spaced apart substrates, the intermediary layer including at least one flexible extension that extends beyond the first and second spaced apart substrates;

a plurality of conductive lines on at least one of the first and second spaced apart substrates, that extend onto the flexible intermediary layer and extend along the flexible intermediary layer onto the at least one flexible extension; and an integrated circuit mounting region;

wherein the first spaced apart substrate includes at least one aperture that exposes a first face of the intermediary layer, such that the second face of the intermediary layer that is opposite the first face of the intermediary layer exposed by the at least one aperture, is supported by the second spaced apart substrate; and wherein the integrated circuit mounting region is on the first face of the intermediary layer exposed by the at least one aperture.

2. A microelectronic package for mounting microelectronic devices thereon, comprising:

a substrate;

a layer integrally formed on the substrate that is flexible relative to the substrate, the flexible layer including a plurality of flexible extensions that extend in parallel beyond the substrate;

a plurality of conductive lines on the substrate, that extend onto the flexible layer and extend along the flexible layer onto the plurality of flexible extensions; and an integrated circuit mounting region;

wherein the substrate includes at least one aperture that exposes the flexible layer; and wherein the integrated circuit mounting region is on the flexible layer exposed by the at least one aperture.

3. A microelectronic package according to claim 2 wherein the substrate is a printed circuit board.

4. A microelectronic package according to claim 2 further comprising a plurality of connecting pads on the plurality of flexible extensions, a respective one of which is connected to a respective one of the plurality of conductive lines.

5. A microelectronic package according to claim 14 wherein the plurality of connecting pads are nonlinearly arranged on the plurality of flexible extensions.

6. A microelectronic package according to claim 5 wherein the plurality of connecting pads are arranged in two rows of alternating pads on the plurality of flexible extensions.

7. A microelectronic package for mounting microelectronic devices thereon, comprising:

a first substrate and a second substrate that is spaced apart from the first substrate;

an intermediary layer between the first and second spaced apart substrates, the intermediary layer being flexible relative to the first and second spaced apart substrates, the intermediary layer including at least one flexible extension that extends beyond the first and second spaced apart substrates;

a plurality of conductive lines on at least one of the first and second spaced apart substrates, that extend onto the flexible intermediary layer and extend along the flexible intermediary layer onto the at least one flexible extension; and a plurality of connecting pads on the at least one flexible extension, a respective one of which is connected to a respective one of the plurality of conductive lines, wherein the plurality of connecting pads are arranged in a plurality of repeated slanting lines on the at least one flexible extension.

8. A microelectronic package according to claim 1 wherein the first and second spaced apart substrates are first and second printed circuit boards.

9. A microelectronic package according to claim 1 wherein the at least one flexible extension comprises a plurality of flexible extensions that extend in parallel beyond the first and second spaced apart substrates.

10. A microelectronic package for mounting microelectronic devices thereon, comprising:

a substrate;

a layer integrally formed on the substrate that is flexible relative to the substrate, the flexible layer including at least one flexible extension that extends beyond the substrate;

a plurality of conductive lines on the substrate, that extend onto the flexible layer and extend along the flexible layer onto the at least one flexible extension;

an integrated circuit mounting region; and a plurality of connecting pads on the at least one flexible extension, a respective one of which is connected to a respective one of the plurality of conductive lines;

wherein the substrate includes at least one aperture that exposes the flexible layer;

wherein the integrated circuit mounting region is on the flexible layer exposed by the at least one aperture; and wherein the plurality of connecting pads are arranged in a plurality of repeated slanting lines on the at least one flexible extension.

11. A Liquid Crystal Display (LCD) module comprising:

an LCD panel including a plurality of spaced apart data lines and a plurality of spaced apart gate lines that intersect the data lines; and a microelectronic package, comprising:

a first substrate and a second substrate that is spaced apart from the first substrate;

an intermediary layer between the first and second spaced apart substrates, the intermediary layer being flexible relative to the first and second spaced apart substrates, the intermediary layer including at least one flexible extension that extends beyond the first and second spaced apart substrates; and a plurality of conductive lines on at least one of the first and second spaced apart substrates, that extend onto the flexible intermediary layer and extend along the flexible intermediary layer onto the at least one flexible extension, the plurality of conductive lines on the at least one flexible extension being electrically connected to the data lines, the gate lines or both the data lines and the gate lines.

12. An LCD module according to claim 11 wherein the first and second spaced apart substrates are first and second printed circuit boards.

13. An LCD module according to claim 11 wherein the at least one flexible extension comprises a plurality of flexible extensions that extend in parallel beyond the first and second spaced apart substrates.

14. An LCD module according to claim 11 further comprising:

a plurality of first connecting pads on the at least one flexible extension, a respective one of which is connected to a respective one of the plurality of conductive lines; and a plurality of second connecting pads on the LCD panel, at locations corresponding to the plurality of first connecting pads, a respective one of the second connecting pads being connected to a respective one of the plurality of data lines or gate lines;

the plurality of first connecting pads being connected to the plurality of second connecting pads.

15. An LCD module according to claim 14 wherein the plurality of first connecting pads are nonlinearly arranged on the at least one flexible extension and wherein the plurality of second connecting pads are at corresponding nonlinearly arranged locations on the LCD panel.

16. An LCD module according to claim 14 wherein the plurality of first connecting pads are arranged in a plurality of repeated slanting lines on the at least one flexible extension and wherein the plurality of second connecting pads are arranged at a corresponding plurality of repeated slanting lines on the LCD panel.

17. An LCD module according to claim 14 wherein the plurality of first connecting pads are arranged in two rows of alternating pads on the at least one flexible extension and wherein the plurality of second connecting pads are arranged at a corresponding two rows of alternating pads on the LCD panel.

18. An LCD module according to claim 11 further comprising:

an integrated circuit mounting region on the microelectronic package; and at least one integrated circuit mounted on the integrated circuit mounting region.

19. An LCD module according to claim 18 wherein the integrated circuit mounting region and the at least one integrated circuit are on one of the first and second spaced apart substrates, opposite the intermediary layer.

20. An LCD module according to claim 18:

wherein one of the first and second spaced apart substrates includes at least one aperture that exposes the intermediary layer; and wherein the integrated circuit mounting region and the at least one integrated circuit are on the intermediary layer exposed by the at least one aperture.

* * * * *

UNITED STATES PATENT AND TRADEMARK OFFICE
CERTIFICATE OF CORRECTION

PATENT NO. : 6,061,246
DATED : May 9, 2000
INVENTOR(S) : Oh et al.

It is certified that error appears in the above-identified patent and that said Letters Patent is hereby corrected as shown below:

In the Title:

Please delete "MICROELECTRIC" and substitute -- MICROELECTRONIC -- therefor.

At Column 7, line 42, please delete "14" and substitute -- 4 -- therefor.

Signed and Sealed this

Eighth Day of May, 2001

*Attest:*

NICHOLAS P. GODICI

*Attesting Officer*    Acting Director of the United States Patent and Trademark Office